United States Patent
Chabal et al.

(10) Patent No.: US 6,723,581 B1
(45) Date of Patent: Apr. 20, 2004

(54) SEMICONDUCTOR DEVICE HAVING A HIGH-K GATE DIELECTRIC AND METHOD OF MANUFACTURE THEREOF

(75) Inventors: Yves Jean Chabal, Holmdel, NJ (US); Martin Laurence Green, Summit, NJ (US); Glen David Wilk, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/274,765

(22) Filed: Oct. 21, 2002

(51) Int. Cl.$^7$ ................................................ H01L 21/00
(52) U.S. Cl. ........................ 438/104; 438/287; 438/785
(58) Field of Search ................................ 438/104, 216, 438/287, 591, 785

(56) References Cited

U.S. PATENT DOCUMENTS

| | | | |
|---|---|---|---|
| 2002/0100946 A1 | * | 8/2002 | Muller et al. ............. 438/216 |
| 2002/0102797 A1 | * | 8/2002 | Muller et al. ............. 438/287 |
| 2002/0190251 A1 | * | 12/2002 | Kunitake et al. .......... 438/104 |
| 2003/0049942 A1 | * | 3/2003 | Haukka et al. ............ 438/785 |
| 2003/0064607 A1 | * | 4/2003 | Leu et al. ................. 438/780 |

* cited by examiner

Primary Examiner—Chandra Chaudhari

(57) ABSTRACT

The present invention provides a method of manufacturing a semiconductor device comprising, providing a semiconductor substrate, forming a substantially-hydroxylated $SiO_xH_y$ layer on the semiconductor substrate in a presence of oxygen and hydrogen, and forming a metallic oxide, high-K dielectric layer on the substantially-hydroxylated $SiO_xH_y$ layer. The substantially-hydroxylated $SiO_xH_y$ layer has a surface concentration of hydroxyl (OH) species equal to or greater than about $3 \times 10^{14}$ hydroxyl per $cm^2$.

20 Claims, 7 Drawing Sheets

SEMICONDUCTOR DEVICE HAVING A HIGH-K GATE DIELECTRIC AND METHOD OF MANUFACTURE THEREOF

TECHNICAL FIELD OF THE INVENTION

The present invention is directed, in general, to a semiconductor device and, more specifically, to a semiconductor device having a high-K gate dielectric and a method of manufacture thereof.

BACKGROUND OF THE INVENTION

In order to produce the required drive currents for state-of-the-art submicron devices, high gate capacitance is essential. Because gate stack capacitance is directly proportional to the material dielectric constant (K) and inversely proportional to the dielectric material thickness, either of these factors may be varied appropriately to increase the overall gate stack capacitance. Silicon dioxide ($SiO_2$) has long been the gate dielectric material of choice. Decreasing the gate dielectric thickness, which is typically a silicon dioxide ($SiO_2$) layer, has reached its functional limit in devices with sizes in the lower submicron range. Because $SiO_2$ has a relatively low dielectric constant (K=3.9), such scaling soon results in $SiO_2$ layers so thin (from about 1.0 nm to about 1.5 nm) that excessive leakage current compromises transistor performance. Therefore, alternative higher-dielectric constant gate materials will be required as device sizes become ever smaller. It has been widely suspected that an underlayer, between the silicon substrate and the high-K dielectric layer, will be needed to facilitate growth of the high-K dielectric layer, as well as to enhance the electrical properties of the interface. However, both this underlayer and the high-K dielectric layer should be as thin as possible in order to minimize the effective oxide thickness (EOT) of the gate dielectric stack and maximize the capacitance. High capacitance enables the transistor to turn on and off more effectively.

However, other elements/compounds such as aluminum oxide ($Al_2O_3$), zirconium oxide ($ZrO_2$), hafnium oxide ($HfO_2$) and titanium oxide ($TiO_2$) that have higher dielectric constants ranging from about 10 to about 80 are not "native" to the silicon that typically forms the substrate. That is to say, they all require the introduction of some other material to form the dielectric other than the conventional method of exposing silicon to oxygen with heat thereby forming the $SiO_2$ dielectric. Thus, higher-K dielectrics must be deposited in a separate step requiring additional controls and incurring additional problems of uneven growth, addition of an extraneous metallic element to silicon/silicon dioxide, etc. Thus, the silicon/silicon dioxide interface is highly desirable but for its limited application in extremely small submicron devices.

In order to facilitate growth of a high-K dielectric gate material during an atomic layer deposition (ALD) process, the surface upon which the high-K dielectric gate material is to be deposited should be substantially-hydroxylated. That is, high OH surface concentrations are more suitable to provide nucleation for ALD of the high-K gate material. However, the difficulty of forming a uniform, hydroxylated surface suitable for a subsequent ALD process is extremely problematic.

For example, two thermal processes, i.e., rapid thermal oxidation and rapid thermal oxynitridation, are commonly used to form such a surface. However, thermal oxide surfaces contain a low hydroxyl content. In addition, the growth rate and uniformity are difficult to control, resulting in an uneven underlayer.

Accordingly, what is needed in the art is a gate dielectric structure and method of forming the same that do not exhibit the limitations of the prior art.

SUMMARY OF THE INVENTION

To address the above-discussed deficiencies of the prior art, the present invention provides in one embodiment a method of manufacturing a semiconductor device comprising providing a semiconductor substrate, forming a substantially-hydroxylated $SiO_xH_y$ layer on the semiconductor substrate in a presence of oxygen and hydrogen, and forming a metallic oxide, high-K dielectric layer on the substantially-hydroxylated $SiO_xH_y$ layer. The substantially-hydroxylated $SiO_xH_y$ layer has a surface concentration of hydroxyl (OH) species equal to or greater than about $3 \times 10^{14}$ hydroxyl per $cm^2$.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the electronics industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
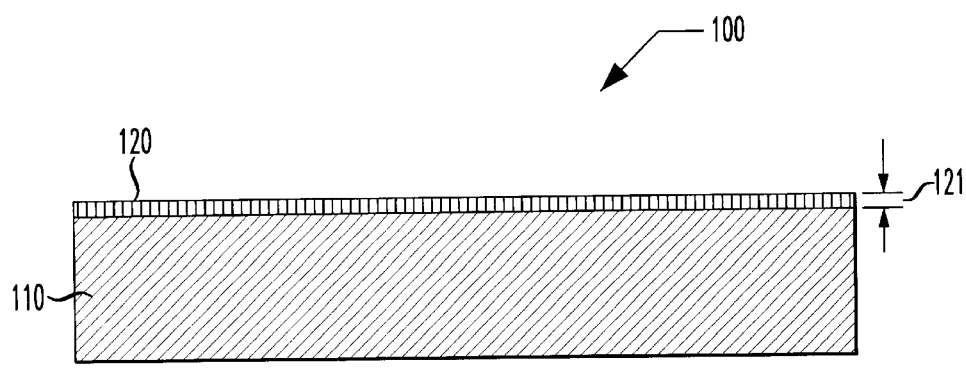
FIG. 1 illustrates a sectional view of a semiconductor device substrate at an early stage of manufacture according to the principles of the present invention.

Referring initially to FIG. 1, illustrated is a sectional view of a semiconductor device 100 at an early stage of manufacture according to the principles of the present invention. In a preferred embodiment at this stage, the semiconductor device 100 comprises a semiconductor substrate 110 and a substantially-hydroxylated layer 120. As used herein the substantially hydroxylated layer 120 is a layer that has a surface concentration of hydroxyl (OH) species equal to or greater than about $3 \times 10^{14}$ hydroxyl per $cm^2$ and will be referred to hereinafter to a hydroxylated layer 120. The semiconductor substrate 110 of the illustrated embodiment is a wafer of substantially-pure silicon and may be any surface on which a layer can be deposited. For example, one who is skilled in the art will recognize that a substrate may also occur at any intermediate stage, e.g., epitaxial, interlevel layer, etc., resulting from an integrated circuit manufacturing process. In one embodiment, the hydroxylated layer 120 is an ultra-thin layer substantially comprising hydroxl-terminated silicon ($SiO_xH_y$) formed by chemical oxidation at a temperature less than about 450° C. in the presence of at least hydrogen and oxygen. In an advantageous embodiment, the hydroxylated layer 120 substantially comprises silanol groups (Si—OH). In a preferred embodiment, the hydroxylated layer 120 may be formed at a temperature less than about 65° C. by immersing an essentially pure-silicon wafer in a bath comprising de-ionized water and ozone ($O_3$). That is, a pure silicon wafer is covered with an ultra-thin layer that is substantially hydroxyl-radical (OH) terminated on its surface. For the purposes of the present discussion, an ultra-thin layer is defined as one that is less than about 1 nm thick. A substantially hydroxl-radical terminated surface is a surface having a concentration of hydroxyl (OH) ions equal to or greater than about $3 \times 10^{14}$ hydroxyl species per $cm^2$. The hydroxylated layer 120 is substantially two-dimensional. That is, a thickness 121 of the hydroxylated layer 120 ranges from about 0.3 nm to about 1.0 nm. In a preferred embodiment, the hydroxylated layer 120 thickness is about 0.5 nm.

More specifically, in one embodiment, the hydroxylated layer 120 is formed by placing the semiconductor substrate 110 in a first rinse comprising de-ionized water followed by a second rinse of de-ionized water containing about 5 ppm ozone ($O_3$). The de-ionized water/ozone bath provides an environment having both hydrogen and oxygen ions in abundance. Pure silicon immersed in the de-ionized water/ozone bath chemically reacts at about room temperature to form $SiO_xH_y$ in a non-linear process. That is, the thickness 121 of about 0.5 nm of $SiO_xH_y$ will form in about 30 seconds. More specifically, the thickness 121 was measured in the sample to be about 0.56 nm. This sample will be subsequently referred to as a $DI/O_3$ (deionized water, ozone) chemical oxide. However, to achieve greater thickness, e.g., about 0.7 nm, requires immersion for about 15 minutes. These thicknesses were measured using ellipsometry which is known to one who is skilled in the art. Thicknesses much greater than about 0.7 nm formed with this process are generally not practical, nor desirable. However, because the desired hydroxylated layer 120 thickness 121 is preferably about 0.5 nm for the present invention, the chemical immersion process is virtually ideal with respect to time-to-form and the convenience of near room temperature reaction in readily available chemicals. The presence of the hydroxylated layer 120 is highly advantageous for the next step of the process which involves atomic layer deposition (ALD) of a uniform high-K dielectric material to be discussed below.

In other embodiments of the present invention, the hydroxylated layer 120 may alternatively be formed using other chemical oxide processes, which are designated herein as SC1 and SC2. The SC1 process involved immersion of an essentially-pure silicon substrate in a rinse comprising 200 parts of de-ionized water ($H_2O$), 4 parts of 30 percent hydrogen peroxide ($H_2O_2$) and 1 part of 29 percent ammonium hydroxide ($NH_3OH$) at a temperature of 45° C. for 10 minutes. The resulting hydroxylated layer 120 measured 0.50 nm by ellipsometric microscopy.

The SC2 process involved immersion of an essentially-pure silicon substrate in a rinse comprising 100 parts de-ionized water, 2 parts of 30 percent hydrogen peroxide ($H_2O_2$), and 1 part of 37 percent hydrochloric acid (HCl) at a temperature of 65° C. for about 10 minutes. The resulting hydroxylated layer 120 measured 0.17 nm by ellipsometric microscopy.

In contrast to the processes covered by the present invention, other samples were prepared using two different conventional rapid thermal processes. In rapid thermal oxidation (RTO) after a de-ionized water rinse, a silicon substrate was subjected to about 900° C. in an oxygen-only atmosphere for about 35 seconds to form a thermal oxide layer analogous to the hydroxylated layer 120. Laboratory results of this RTO process showed an ellipsometric thermal oxide layer thickness 121 of about 1.05 nm. In the rapid thermal oxynitride (RTNO) process, the silicon substrate, after a de-ionized water rinse, was subjected to about 850° C. in an atmosphere of 60 percent oxygen ($O_2$) and 40 percent nitric oxide (NO) for about 10 seconds to form a thermal oxynitride layer analogous to the hydroxylated layer 120. Laboratory results of this RTNO process showed an ellipsometric thermal oxynitride layer thickness 121 of about 0.53 nm. These processes are given here for future comparison with the end gate results obtained using the hydroxylated layer 120 formed according to the principles of the present invention.

As a further basis for comparison, a process of forming a high-K, metallic oxide layer upon a bare (H-terminated) silicon wafer was also conducted. To prepare the silicon wafer, native oxide was removed in a 50:1 $H_2O$:HF bath followed by immersion for 10 minutes at room temperature in a de-ionized water rinse before forming a $HfO_2$ film by ALD directly on the rinsed surface. This process resulted in a sample that was substantially devoid of any hydroxylated, oxide or oxynitride layer as described for the previous processes. This sample will be subsequently referred to as the HF-last sample.

It should be noted that throughout the above processes, hydroxylated-, oxide, and oxynitride layer thicknesses 121 were measured with recipes calibrated for $SiO_2$. Therefore, the thicknesses of the thermal oxides (RTO, RTNO) are accurate, but those of the chemical oxides ($DI/O_3$, SC1, SC2) of the present invention are not, because chemical oxides are more predominantly Si—O—H than $SiO_2$. However, the ellipsometric measurements serve to compare the relative thicknesses of the chemical oxides ($DI/O_3$, SC1, SC2).

Figure 2:
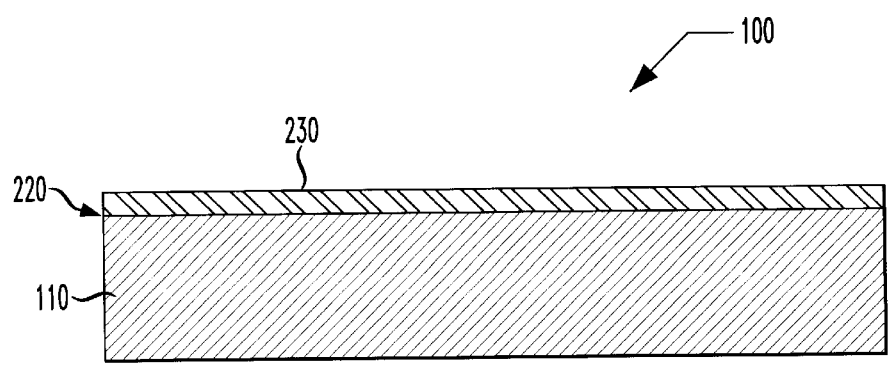
FIG. 2 illustrates a sectional view of the semiconductor device of FIG. 1 at an intermediate stage of manufacture.

Referring now to FIG. 2 with continuing reference to FIG. 1, illustrated is a sectional view of the semiconductor device 100 of FIG. 1 at an intermediate stage of manufacture. The semiconductor device 100 now comprises the semiconductor substrate 110 and a high-K dielectric layer 230. It should be noted that the hydroxylated layer 120 (FIG. 1) is transformed during the atomic layer deposition of the high-K dielectric on wafers ($DI/O_3$, SC1, SC2) prepared in accordance with the principles of the present invention such that the hydroxylation is greatly reduced. That is, the hydroxyl (OH) bond is broken and the hydrogen is substantially replaced with the metal ion that will form the high-K dielectric. Of course, in the cases of the conventional thermal oxides (RTO, RTNO), the analogous $SiO_2$ layer may still be distinguished at location 220 from the semiconductor substrate 110 and the high-K dielectric layer 230. Clearly, in the case of the HF-last sample, the high-K dielectric 230 forms directly on the semiconductor substrate 110.

The high-K dielectric may, in a preferred embodiment, be a hafnium oxide ($HfO_2$) layer 230 that is deposited by an ALD process. While the present discussion is directed to deposition of the high-K dielectric by ALD, it should be understood that other known deposition processes may also be used. Also, it should be understood that other high-K dielectric materials such as: aluminum oxide ($Al_2O_3$), zirconium oxide ($ZrO_2$), lanthanum oxide ($La_2O_3$), yttrium oxide ($Y_2O_3$), or titanium dioxide ($TiO_2$) may also be used as well as other deposition processes. In alternative embodiments, dual metal oxides such as: zirconium silicate ($ZrSiO_4$), hafnium silicate ($Hf_xSi_yO_z$), hafnium aluminate ($Hf_xAl_yO_z$), or zirconium aluminate ($Zr_xAl_yO_z$) may be used.

Comparative studies were performed by depositing $HfO_2$ by ALD on each of the above described samples prepared with: a hydroxylated layer formed in accordance with the present invention ($DI/O_3$, SC1, SC2), a conventional thermal oxide/oxynitride layer (RTO, RTNO), or devoid of any hydroxylated-, oxide or oxynitride layer (HF-last). The goal during processing was to form a substantially two-dimensionally-continuous $HfO_2$ film on the thinnest possible hydroxylated layer 120 so that a gate oxide with minimum effective oxide thickness (EOT) would result. For the purposes of this discussion and FIG. 7, a layer with minimum EOT is considered to be less than or equal to about 1.8 nm.

Hafnium oxide films were grown using an $H_2O/HfCl_4$ chemistry in a commercial ALD tool. Within about five minutes after hydroxylated- or oxide/oxynitride layer preparation, as appropriate for the samples described above, the wafers were loaded into an ALD tool loadlock, where they remained at a pressure of about $10^{-2}$ Torr until each was transferred to the deposition chamber. The $HfO_2$ films were grown on each of the above-referenced samples at about 300° C. with one cycle of $HfO_2$ growth consisting of about a 400 ms pulse of $H_2O$, followed by about a 200 ms pulse of $HfCl_4$. The pulses were separated by several seconds and carried by a flow of nitrogen ($N_2$). The total pressure during growth was about 1.5 Torr. The $HfCl_4$ solid source was kept at about 200° C. and the $H_2O$ source was kept at about 18° C. Films as thin as 1 growth cycle and as thick as 100 growth cycles with suitable intermediates, depending upon the particular wafer, were prepared. The resultant films were analyzed by atomic force microscopy (AFM), Rutherford Backscattering (RBS) and Time Of Flight Secondary Ion Mass Spectroscopy (TOFSIMS).

Figure 3:
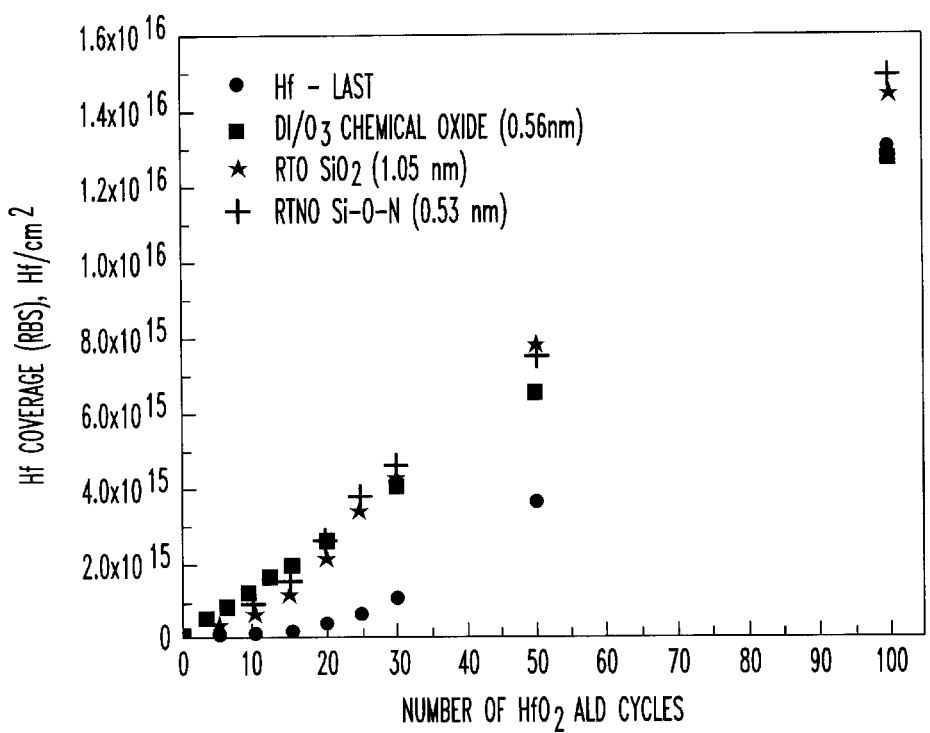
FIG. 3 illustrates a graph of hafnium coverage, measured by Rutherford Backscattering Spectroscopy (RBS), as a function of the number of $HfO_2$ deposition cycles for the pre-treated wafers described above.

Referring now to FIG. 3, illustrated is a graph of hafnium coverage, measured by RBS, as a function of the number of $HfO_2$ deposition cycles for the pre-treated wafers described above. Those wafers represented are: $DI/O_3$ Chemical Oxide (0.56 nm) as provided by the present invention, conventional RTO $SiO_2$, conventional RTNO Si—O—N, and conventional HF-last. By measuring hafnium coverage with RBS, rather than an indirect measure of $HfO_2$ thickness, e.g., optical ellipsometric thickness, a fundamental unambiguous measure of $HfO_2$ nucleation and growth behavior was obtained. It can be seen in FIG. 3 that although there are differences in growth behavior among the various samples, the HF-last (no hydroxylated- or oxide/oxynitride layer) case was the most distinct from the rest. In this case, there is a very large nonlinear growth component at low hafnium coverage. It is believed that this can be interpreted as a nucleation barrier characteristic of the H-terminated surface, seen before for ALD zirconium oxide ($ZrO_2$) growth on H-terminated silicon.

Figure 4:
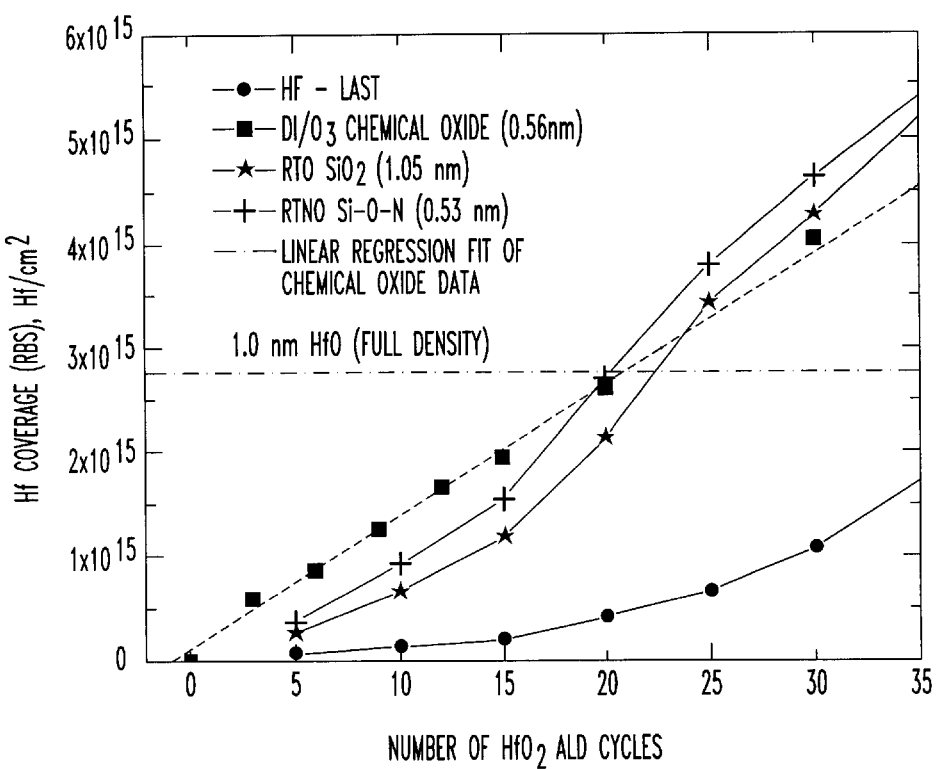
FIG. 4 illustrates a subset of the data of FIG. 3 for samples exposed to $\leq 30$ atomic layer deposition $HfO_2$ (ALD)cycles.

Referring now to FIG. 4, illustrated is a subset of the data of FIG. 3 for samples exposed to $\leq 30$ $HfO_2$ ALD deposition cycles. Two extreme growth behaviors can be observed: (a) the nonlinear growth of the HF-last treated samples, and (b) the linear, well-behaved growth on the chemical oxide, $DI/O_3$-treated hydroxylated sample. The linear growth of the $DI/O_3$-treated sample, observed from about 3 cycles onward, implies an orderly growth process in which little or no barrier to hafnium oxide nucleation exists. It is theorized that the ease of nucleation is due to the much greater and more uniform distribution of hydroxyl radical (OH) content of the hydrous, chemical oxide. The conventional, thermally-grown oxide, oxynitride and HF-last samples exhibited a substantially less-linear relationship as compared to the chemical oxide $DI/O_3$ process provided by the present invention. As part of the investigation, an attempt was made to introduce hydroxyl groups to a conventional thermal oxynitride sample by subjecting a Si—O—N sample to 6 initial $H_2O$ pulses prior to the $H_2O/HfCl_4$ ALD cycles. No difference was seen in the nucleation and growth behavior in this case as compared to the conventional Si—O—N sample. However, a substantial number of $H_2O$ pulses may result in significant formation of hydroxyl groups.

It can further be seen from FIG. 4 that the conventional thermally-grown (RTO $SiO_2$, RTNO Si—O—N) and H-terminated silicon (HF-last) samples represent a stark contrast when compared to the linearity of the chemical ($DI/O_3$) oxides provided by the present invention. That is, below about 1 nm thickness of $HfO_2$ (based on theoretical molecular density), growth on the conventional (RTO, RTNO, and HF-last) samples exhibits significant non-linearity. Growth on the chemical $DI/O_3$ oxide is much more linear in contrast to the growth on the thermal (RTO, RTNO) oxides and the HF-last sample. Therefore, $HfO_2$ growth on the chemical $DI/O_3$ oxides provided by the present invention exhibits little or no barrier to nucleation when compared to the samples prepared by conventional processes.

The slope of the linear regression fit to the chemical oxide $DI/O_3$ data of FIG. 4 yields a value of $(1.26\pm0.01)\times10^{14}$ $Hf/cm^2$/cycle. The maximum allowable $HfO_2$ coverage per ALD cycle may be calculated simply as the $HfO_2$ molecular density to the 2/3 power, equal to $9.15\times10^{14}$ $HfO_2/cm^2$. Thus, only 14 percent coverage is achieved per cycle, and about 7 deposition cycles are needed to cover the surface, assuming perfect two-dimensional growth. It is very typical, due to steric hindrance problems, for ALD growth to result in only partial monolayer growth per cycle.

Figure 5:
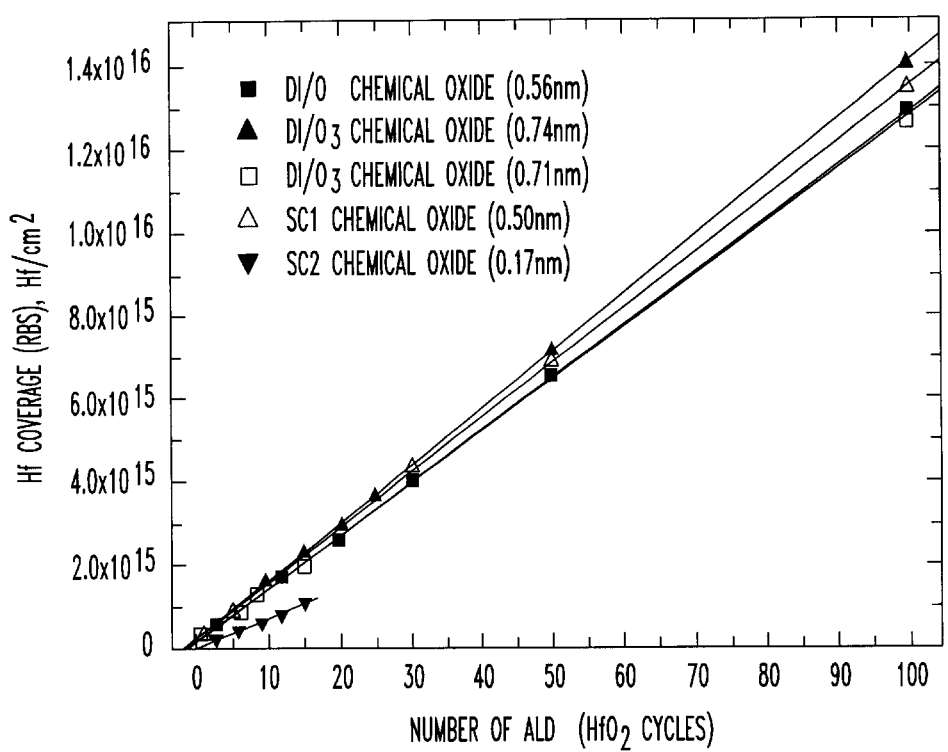
FIG. 5 illustrates a graph of $HfO_2$ growth data on the various chemical oxides detailed above.

Referring now to FIG. 5, illustrated is a graph of $HfO_2$ growth data on various chemical oxide samples prepared in accordance with the present invention as discussed above. It can be seen from FIG. 5 that growth on the referenced chemical oxides ($DI/O_3$ and SC1), whose thicknesses range from about 0.50 nm to about 0.74 nm, results in substantially linear growth behavior, which is very unexpected in contrast to results for conventional deposition processes.

Referring now to Table 1 with continuing reference to FIG. 5, illustrated is an analysis of $HfO_2$ growth data on the chemical oxides of FIG. 5.

TABLE 1

Analysis of HfO$_2$ Growth Data on Chemical Oxides of FIG. 5

| Underlayer | Thickness (nm) | Growth Rate ($10^{14}$ Hf/cm2/cycle) | % of "Max" Growth Rate | Intercept (Hf = 0) (Cycles) | Goodness of fit |
|---|---|---|---|---|---|
| DI/O$_3$ Chem Oxide | 0.56 | 1.26 ± 0.01 | 14 | −1.2 | 0.9998 |
| DI/O$_3$ Chem Oxide | 0.74 | 1.37 ± 0.01 | 15 | −1.7 | 0.9998 |
| DI/O$_3$ Chem Oxide | 0.71 | 1.25 ± 0.01 | 14 | −1.5 | 0.9998 |
| SC1 Chem Oxide | 0.50 | 1.32 ± 0.02 | 14 | −1.2 | 0.9992 |

Table 1 shows that in all cases, the goodness of fit for linear regression is high, and a negative intercept between 1.2 and 1.7 is observed for Hf=0. Because negative growth cycles are not physically meaningful, this implies that growth in the first or second cycles must be non-linear, with a higher Hf coverage per cycle. Furthermore, the coverage per cycle is between 14 percent and 15 percent of a monolayer. The 10 percent variation in coverage per cycle observed among the other various chemical oxide samples is presumably due to variations in OH content on the surface of the samples, micro-roughness of the substrates, and ALD tool growth parameters.

Referring now back to FIG. 4 with continuing reference to FIG. 5, it is clearly seen that in the early stages of growth, HfO$_2$ coverage per cycle is highest for the chemical oxide (DI/O$_3$) samples and lower for the conventional (RTO, RTNO) oxides and the HF-last sample. At some point, when the substrate is completely covered with HfO$_2$, growth rate per cycle should be the same for all cases, since HfO$_2$ cycles are then grown on HfO$_2$, and are no longer influenced by the presence of a hydroxylated- or oxide/oxynitride layer or absence thereof, as in the HF-last sample. However, when growing on HfO$_2$, growth may be influenced by the roughness of the HfO$_2$ layer. Such roughness is probably due to a three-dimensional island structure resulting from initial nucleation difficulty, e.g., the HF-last case. The greater surface area of the rougher samples presumably resulted in enhanced late stage growth rate (see FIG. 3) occurring between from about 30 cycles to about 50 cycles for the HF-last case. As can be seen in FIG. 4 this occurs between from about 20 cycles to about 25 cycles for the thermal oxide (RTQ, RTNO) samples. Linear growth, with no nucleation barrier, results in a constant coverage rate per cycle for the chemical oxide (DI/O$_3$) samples.

Figure 6:
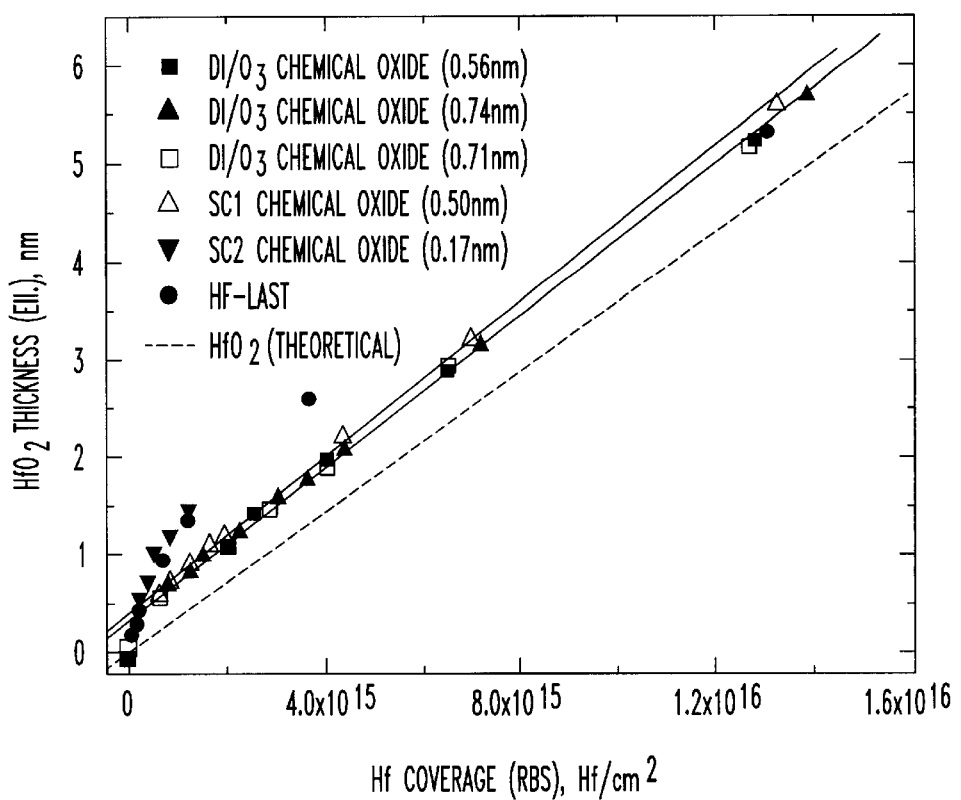
FIG. 6 illustrates a graph of ellipsometric thickness of the $HfO_2$ layers versus hafnium coverage in $Hf/cm^2$.

Referring now to FIG. 6, illustrated is a graph of ellipsometric thickness of the HfO$_2$ layers versus hafnium coverage in Hf/cm$^2$. The ellipsometric thickness was determined using a two-layer model that accounts for and subtracts the oxide/oxynitride layer, or the chemical oxide (DI/O$_3$) layer where it exists, from the thickness. A value of 2.08, measured on a thick (6 nm) ALD HfO$_2$ film, was used for the index of refraction of HfO$_2$. Also plotted is the theoretical relationship between thickness and coverage for HfO$_2$, derived from its crystalline molecular density (2.77× $10^{22}$ HfO$_2$/cm$^3$=2.77×$10^{15}$ HfO$_2$/cm$^2$/nm). The inverse slope of data plotted in this figure is the molecular density of the film. It can be seen that the chemical oxide (DIO$_3$, SC1) sample data is linear with a slope slightly higher (i.e., density slightly lower) than theoretical, except for the SC2 sample, which is highly non-linear, by comparison, just as is the HF-last data. That the chemical oxide (DIO$_3$, SC1) data lies on two lines, and that neither intercepts Hf=0 at an ellipsometric thickness of zero, is a failure of the two-layer ellipsometric model. Refer now also to Table 2 below.

TABLE 2

Molecular Density of HfO$_2$ Films Grown on Various Chemical Oxide Samples from FIG. 6

| Underlayer | Thickness (nm) | HfO$_2$ Molecular Density (x $10^{22}$ HfO$_2$/cm$^3$) | Percent of HfO$_2$ Theoretical Density |
|---|---|---|---|
| DI/O3 Chemical oxide | 0.56 | 2.59 ± 0.03 | 94 |
| DI/O3 Chemical oxide | 0.74 | 2.61 ± 0.01 | 94 |
| DI/O3 Chemical oxide | 0.71 | 2.62 ± 0.04 | 95 |
| SC1 Chemical Oxide | 0.50 | 2.50 ± 0.03 | 90 |

Table 2 is a compilation of the data in FIG. 6, and shows that the density of as-grown HfO$_2$ layers on all chemical oxides, except for perhaps the experimental aberration of SC2, is close to the theoretical value. Therefore, although these HfO$_2$ films grew by about 15 percent of a monolayer per cycle, dense films eventually resulted. Similar high-density ALD ZrO$_2$ films grown on chemical oxides have been observed. Furthermore, the linear behavior observed for growth on the chemical oxide (DIO$_3$, SC1) samples in FIG. 6 demonstrates that for these films, film density is constant during growth, as opposed to the conventional (HF-last) sample, in which the film density (inverse slope) varies as a function of thickness in the earlier stages of growth. This implies a more two-dimensionally continuous growth mode for the chemical oxide films.

Figure 7:
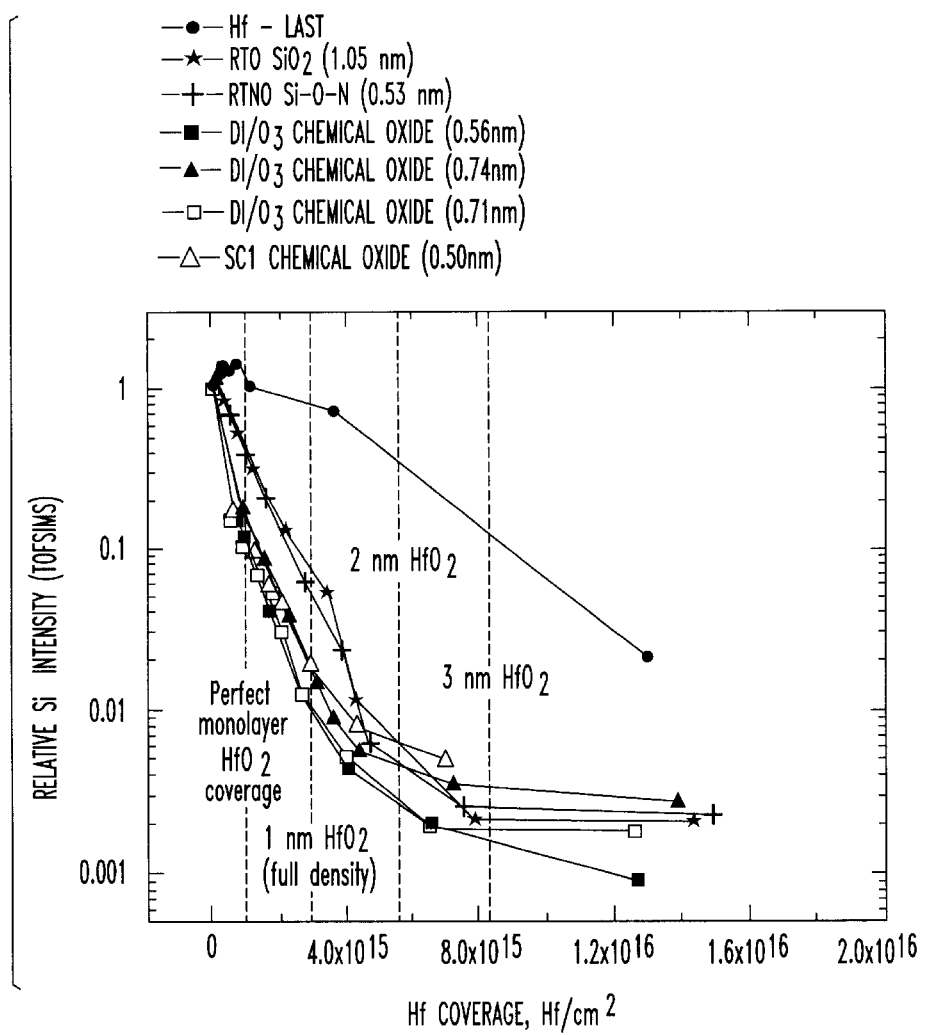
FIG. 7 illustrates a graph of relative silicon intensity versus hafnium coverage for the seven samples described above.

Time Of Flight Secondary Ion Mass Spectroscopy (TOFSIMS) is a surface-sensitive technique capable of measuring how effectively the HfO$_2$ covers the semiconductor substrate surface. Referring now to FIG. 7, illustrated is a graph of relative silicon intensity versus hafnium coverage for the seven samples described above. For a given HfO$_2$ coverage (Hf/cm$^2$), the silicon signal from the semiconductor substrate will be lower, the more two-dimensional (planar) the HfO$_2$ coverage is. The most two-dimensional coverage is revealed by the steepest decrease in silicon TOFSIMS intensity, as a function of hafnium coverage. As can be seen in FIG. 7, all chemical oxide (DI/O$_3$, SC1) samples result in much better two-dimensional HfO$_2$ coverage than the conventional (RTO, RTNO, HF-last) samples. This is consistent with all previous data that points to the difficulty of nucleating HfO$_2$ on H-terminated silicon. Among the samples with hydroxylated- or oxide/oxynitride layers, the drop-off in the silicon signal is steepest for growth on the chemical (DI/O$_3$, SC1) oxides. Thus, HfO$_2$ growth on these samples, facilitated by the high OH content, is the most two-dimensional. The increase in silicon signal observed for the HF-last sample at small HfO$_2$ coverages is attributable to SIMS matrix effects, due to the lack of a hydroxylated- or oxide/oxynitride layer. The discrepancy in silicon signal observed among the chemical (DI/O$_3$) oxide samples at very high HfO$_2$ coverages may be explained as silicon contamination of the HfO$_2$ surfaces by silicone oils from storage boxes, the chamber, etc.

For perfect two-dimensional coverage of a surface by HfO$_2$, one monolayer, a deposited amount of about 9.15× $10^{14}$ HfO$_2$/cm$^2$, equal to about 0.3 nm of fully dense crystalline HfO$_2$, would be required to suppress the silicon signal. It can be seen in FIG. 7 that the silicon signal is not completely suppressed until a hafnium coverage corresponding from about 1.5 nm to about 2.5 nm of HfO$_2$ thickness. Electrical experiments are required to determine the exact $HfO_2$ thickness at which the films are sealed. That is, for example, the point at which no pinholes are evident by excessively high capacitor leakage current.

The quantitative results cited enable an assessment of the probable mechanism of $HfO_2$ ALD growth, particularly on chemical oxide ($DI/O_3$, SC1) samples. Growth does not occur via a monolayer-by-monolayer mode, since only partial (about 15 percent) monolayer growth per cycle is observed (See FIG. 5). After the deposition of about 7 to 8 cycles, the underlying silicon TOFSIMS intensity (See FIG. 7) is about 10 percent of the starting chemical oxide surface value, indicating that about 90 percent of the hydroxylated-layer is covered with $HfO_2$. Therefore, one concludes that two-dimensional growth is quite prevalent, with only 10 percent of the film area thin, or "pin-holed," exposing the silicon beneath. Thus, in every cycle before complete coverage of the hydroxylated-layer, it seems that there is a preference for incoming $HfCl_4$ to react with previously un-reacted Si—OH groups until they are depleted. If the $HfCl_4$ preferentially reacted with previously created Hf—OH sites, the film would exhibit a more three-dimensional, islanded morphology.

In fact, this is probably the case for growth on thermal oxide (RTO, RTNO) samples and especially H-terminated surfaces. The chemical oxide ($DI/O_3$, SC1) hydroxylated-layers provided by the present invention provide a sufficient number of Si—OH reaction sites, thus increasing the probability that $HFCl_4$ will react with one of them, rather than with an Hf—OH site giving rise to a two-dimensional film. Finally, once complete coverage of the hydroxylated-layer is achieved, all further reaction occurs on Hf—OH sites, and coverage per cycle is dictated, to the first order, by the surface area, i.e., roughness, of the film.

Figure 8:
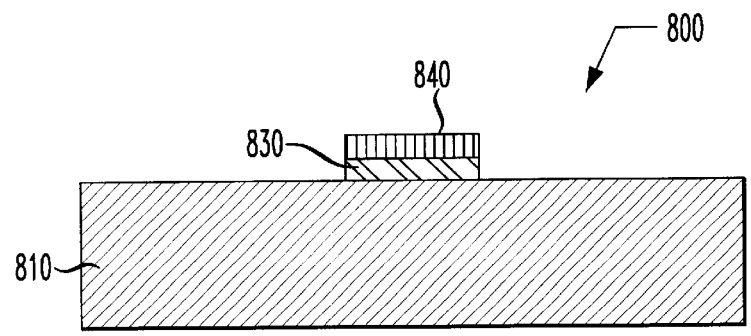
FIG. 8 illustrates a sectional view of a gate stack manufactured in accordance with the principles of the present invention.

Referring now to FIG. 8, illustrated is a sectional view of a gate stack 800 manufactured in accordance with the principles of the present invention. The gate stack 800 comprises a semiconductor substrate 810, a high-K dielectric layer 830 formed in accordance with the principles of the present invention, and a gate electrode 840. In a preferred embodiment, the high-K dielectric layer 830 has been deposited on a hydroxylated layer that has been substantially de-hydroxylated. The high-K dielectric layer 830 comprises a substantially uniform hafnium oxide layer 830 having a minimum effective oxide thickness while allowing very low leakage. Of course, the high-K dielectric layer 830 may also be formed from aluminum oxide, zirconium oxide, lanthanum oxide or titanium oxide. In alternative embodiments, the high-K dielectric layer 830 may also be formed from bi-metallic oxides such as: zirconium silicate, hafnium silicate, hafnium aluminate, zirconium aluminate or other suitable materials. Of course, one who is skilled in the art will recognize that other deposition processes such as chemical vapor deposition (CVD), etc., may also be used.

Figure 9:
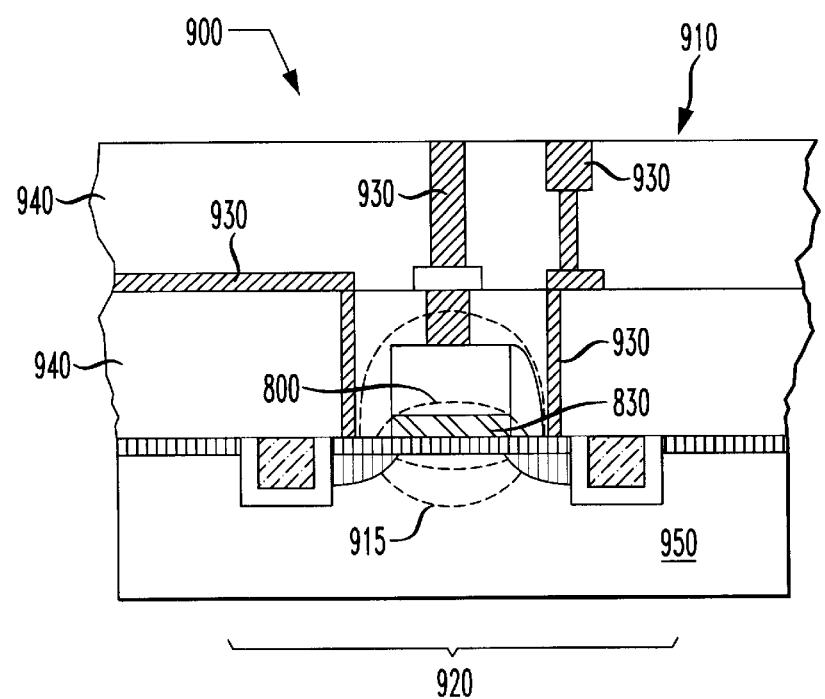
FIG. 9 illustrates a sectional view of one embodiment of a conventional integrated circuit (IC) incorporating the completed gate stack of FIG. 8.

Referring now to FIG. 9, illustrated is a sectional view of one embodiment of a conventional integrated circuit (IC) 900 incorporating the completed gate stack 800 of FIG. 8. The IC 900 may include active devices, e.g., transistors 915, used to form CMOS devices, BiCMOS devices, bipolar devices, memory capacitors, or other types of active devices. The IC 900 may further include passive devices such as inductors or resistors (not shown), or it may also include optical devices or optoelectronic devices. Those skilled in the art are familiar with these various types of devices and their manufacture.

Active devices 910 may be found in an active device region 920 of a semiconductor wafer 950. One who is skilled in the art is familiar with the employment of gates in integrated circuits 900 and especially in transistors 915. In the embodiment illustrated in FIG. 9, components of the conventional IC 900 include transistor(s) 915 (one shown), having a high-K dielectric gate oxide layer 830, formed on the semiconductor wafer 950. The transistor(s) 915 may be metal-oxide semiconductor field effect transistors 915 (MOSFETs); however other types of transistors are within the scope of the present invention. Interlevel dielectric layers 940 are shown deposited over the transistor(s) 915. One who is skilled in the art will recognize that the high-K dielectric gate oxide layer 830 may also be formed at any suitable interlevel dielectric layer 940 of the IC 900. The high-K dielectric gate oxide layer(s) 830 are substantially two-dimensional and formed in accordance with the principles of the present invention, an intermediate step thereof including forming a hydroxylated layer (not shown) on a surface of the semiconductor substrate 950. The hydroxylated layer has been changed by formation of the high-K dielectric gate oxide layer(s) 830.

Interconnect structures 930 are formed in the interlevel dielectric layers 940 to form interconnections between the transistors 915 and other devices (not shown) to form an operative integrated circuit 900. In addition, the interconnect structures 930 also connect the transistor(s) 915 to other areas or components of the IC 900. Those skilled in the art understand how to connect these various devices together to form an operative integrated circuit.

Of course, the method of manufacturing high-K dielectric gates using the present invention is not limited to the manufacture of the particular IC 900 illustrated in FIG. 9. In fact, the present invention is broad enough to encompass the manufacture of any type of integrated circuit formed on a semiconductor wafer which would benefit from the use of high-K dielectric gates located therein, as provided by the present invention. In addition, the present invention is broad enough to encompass integrated circuits having greater or fewer components than illustrated in the IC 900 of FIG. 9.

Thus, the present invention provides a semiconductor device and a method for specifically forming a substantially two-dimensional high-K dielectric gate in an active region of an integrated circuit. Therefore, the invention avoids a need for a substantially thick underlayer and contributes to minimizing the overall thickness of the integrated circuit.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:

providing a semiconductor substrate;

forming a substantially-hydroxylated $SiO_xH_y$ layer on said semiconductor substrate in a presence of oxygen and hydrogen by immersing said substrate in a solution comprising de-ionized water and an oxygen containing compound, said substantially-hydroxylated $SiO_xH_y$ layer having a surface concentration of hydroxyl (OH) species equal to or greater than about $3 \times 10^{14}$ hydroxyl per $cm^2$; and forming a metallic oxide, high-K dielectric layer on said substantially-hydroxylated $SiO_xH_y$ layer.

2. The method as recited in claim 1 wherein said solution is a solution comprising de-ionized water and ozone or de-ionized water and hydrogen peroxide.

3. The method as recited in claim 1 wherein forming a metallic oxide, high-K dielectric layer includes forming a metallic oxide, high-K dielectric selected from the group consisting of:

hafnium oxide;

aluminum oxide;

zirconium oxide;

lanthanum oxide;

yttrium oxide; and titanium dioxide.

4. The method as recited in claim 1 wherein forming a metallic oxide, high-K dielectric layer includes forming a metallic oxide, high-K dielectric selected from the group consisting of:

zirconium silicate;

hafnium silicate;

hafnium aluminate; and zirconium aluminate.

5. The method as recited in claim 1 wherein said metallic oxide, high-K dielectric layer comprises hafnium oxide.

6. The method as recited in claim 1 wherein forming a substantially-hydroxylated $SiO_xH_y$ layer includes forming a substantially-hydroxylated $SiO_xH_y$ layer at a temperature less than about 450° C.

7. The method as recited in claim 1 wherein forming a substantially-hydroxylated $SiO_xH_y$ layer includes forming a substantially-hydroxylated $SiO_xH_y$ layer at a temperature less than about 65° C.

8. The method as recited in claim 1 wherein said substantially-hydroxylated $SiO_xH_y$ layer substantially comprises silanol groups ($Si-O_xH_y$).

9. The method as recited in claim 1 wherein a thickness of said substantially-hydroxylated $SiO_xH_y$ layer ranges from about 0.3 nm to about 1.0 nm.

10. The method as recited in claim 1 wherein said high-K dielectric layer is formed by atomic layer deposition.

11. A method of manufacturing an integrated circuit, comprising:

forming a transistor on a semiconductor substrate, including:

creating a gate on said semiconductor substrate, including:

forming a substantially-hydroxylated $SiO_xH_y$ layer on said semiconductor substrate in a presence of oxygen and hydrogen by immersing said substrate in a solution comprising de-ionized water and an oxygen containing compound, said substantially-hydroxylated $SiO_xH_y$ layer having a surface concentration of hydroxyl (OH) species equal to or greater than about $3 \times 10^{14}$ hydroxyl per $cm^2$; and forming a metallic oxide, high-K dielectric layer on said substantially-hydroxylated $SiO_xH_y$ layer; and forming source/drain regions associated with said gate; and interconnecting said transistor with other transistors to form an operative integrated circuit.

12. The method as recited in claim 11 wherein said solution is a solution comprising de-ionized water and ozone or de-ionized water and hydrogen peroxide.

13. The method as recited in claim 11 wherein forming a metallic oxide, high-K dielectric layer includes forming a metallic oxide selected from the group consisting of:

hafnium oxide;

aluminum oxide;

zirconium oxide;

lanthanum oxide;

yttrium oxide; and titanium dioxide.

14. The method as recited in claim 11 wherein forming a metallic oxide, high-K dielectric layer includes forming a metallic oxide layer from the group consisting of:

zirconium silicate;

hafnium silicate;

hafnium aluminate; and zirconium aluminate.

15. The method as recited in claim 11 wherein said metallic oxide, high-K dielectric layer comprises hafnium oxide.

16. The method as recited in claim 11 wherein forming a substantially-hydroxylated $SiO_xH_y$ layer includes forming a substantially-hydroxylated $SiO_xH_y$ layer at a temperature less than about 450° C.

17. The method as recited in claim 11 wherein forming a substantially-hydroxylated $SiO_xH_y$ layer includes forming a substantially-hydroxylated $SiO_xH_y$ layer at a temperature less than about 65° C.

18. The method as recited in claim 11 wherein said substantially-hydroxylated $SiO_xH_y$ layer substantially comprises silanol groups ($Si-O_xH_y$).

19. The method as recited in claim 11 wherein a thickness of said substantially-hydroxylated $SiO_xH_y$ layer ranges from about 0.3 nm to about 1.0 nm.

20. The method as recited in claim 11 wherein said high-K dielectric layer is formed by atomic layer deposition.

* * * * *